United States Patent
Guo et al.

(10) Patent No.: US 6,734,116 B2
(45) Date of Patent: May 11, 2004

(54) DAMASCENE METHOD EMPLOYING MULTI-LAYER ETCH STOP LAYER

(75) Inventors: Cheng-Cheng Guo, Kaohsiung (TW); Dian-Hau Chen, Hsinchu (TW); Li-Kong Turn, Taichung (TW); Han-Ming Sheng, Hsinchu (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 47 days.

(21) Appl. No.: 10/044,599

(22) Filed: Jan. 11, 2002

(65) Prior Publication Data

US 2003/0134521 A1 Jul. 17, 2003

(51) Int. Cl.[7] .................. H01L 21/31; H01L 21/469
(52) U.S. Cl. .................. 438/792; 438/618; 438/637; 438/638; 438/674; 257/774
(58) Field of Search .................. 438/792, 618, 438/637, 638, 674; 257/774

(56) References Cited

U.S. PATENT DOCUMENTS

| | | | |
|---|---|---|---|
| 6,177,364 B1 | 1/2001 | Huang | |
| 6,440,838 B1 * | 8/2002 | Lui et al. | 438/618 |
| 6,498,399 B2 * | 12/2002 | Chung et al. | 257/438 |

* cited by examiner

Primary Examiner—David Nelms
Assistant Examiner—Reneé R. Berry
(74) Attorney, Agent, or Firm—Tung & Associates

(57) ABSTRACT

Within a damascene method for forming a microelectronic fabrication, there is employed an etch stop layer comprising a comparatively low dielectric constant dielectric material sub-layer having formed thereupon a comparatively high dielectric constant dielectric material sub-layer. Within the method there is also simultaneously etched: (1) an anti-reflective coating layer from an inter-metal dielectric layer; and (2) the etch stop layer from a contact region. The microelectronic fabrication is formed with enhanced performance and enhanced reliability.

14 Claims, 2 Drawing Sheets

DAMASCENE METHOD EMPLOYING MULTI-LAYER ETCH STOP LAYER

BACKGROUND OF THE INVENTION

1. Field of the Invention

The present invention relates generally to damascene methods for forming microelectronic fabrications. More particularly, the present invention relates to damascene methods for forming, with enhanced performance and enhanced reliability, microelectronic fabrications.

2. Description of the Related Art

Microelectronic fabrications are formed from microelectronic substrates over which are formed patterned microelectronic conductor layers which are separated by microelectronic dielectric layers.

As microelectronic fabrication integration levels have increased and microelectronic device and patterned microelectronic conductor layer dimensions have decreased, it has become increasingly common in the art of microelectronic fabrication to employ interposed between the patterns of patterned microelectronic conductor layers when fabricating microelectronic fabrications microelectronic dielectric layers formed of comparatively low dielectric constant dielectric materials. Such comparatively low dielectric constant dielectric materials generally have dielectric constants in a range of from about 1.5 to less than about 4.0. For comparison purposes, microelectronic dielectric layers formed within microelectronic fabrications from conventional silicon oxide dielectric materials, silicon nitride dielectric materials and silicon oxynitride dielectric materials typically have comparatively high dielectric constants in a range of from greater than about 4.0 to about 8.0. Similarly, microelectronic fabrications comprising patterned microelectronic conductor layers having formed interposed between their patterns microelectronic dielectric layers formed of comparatively low dielectric constant dielectric materials are typically formed within microelectronic fabrications while employing damascene methods, including in particular dual damascene methods.

Microelectronic dielectric layers formed of comparatively low dielectric constant dielectric materials are desirable in the art of microelectronic fabrication formed interposed between the patterns of patterned microelectronic conductor layers within microelectronic fabrications insofar as such microelectronic dielectric layers formed of dielectric materials having comparatively low dielectric constants provide microelectronic fabrications which may theoretically operate at higher microelectronic fabrication speeds, with attenuated patterned microelectronic conductor layer parasitic capacitance and attenuated patterned microelectronic conductor layer cross-talk.

Similarly, damascene methods are desirable in the art of microelectronic fabrication for forming patterned microelectronic conductor layers having formed interposed between their patterns microelectronic dielectric layers formed of comparatively low dielectric constant dielectric materials insofar as damascene methods are comparatively simple fabrication methods which may often be employed to fabricate microelectronic structures which are not otherwise practicably accessible in the art of microelectronic fabrication.

While damascene methods are thus desirable in the art of microelectronic fabrication for forming microelectronic fabrications comprising patterned microelectronic conductor layers having formed interposed between their patterns microelectronic dielectric layers formed of comparatively low dielectric constant dielectric materials, damascene methods are nonetheless not entirely without problems in the art of microelectronic fabrication for forming microelectronic fabrications comprising patterned microelectronic conductor layers having formed interposed between their patterns microelectronic dielectric layers formed of comparatively low dielectric constant dielectric materials. In that regard, while damascene methods are generally successful for forming microelectronic fabrications comprising patterned microelectronic conductor layers having formed interposed between their patterns microelectronic dielectric layers formed of comparatively low dielectric constant dielectric materials, such damascene methods are often difficult to employ for forming, with enhanced performance and enhanced reliability, microelectronic fabrications comprising patterned microelectronic conductor layers having formed interposed between their patterns microelectronic dielectric layers formed of comparatively low dielectric constant dielectric materials.

It is thus desirable in the art of microelectronic fabrication to provide damascene methods which may be employed for forming, with enhanced performance and enhanced reliability, microelectronic fabrications comprising patterned microelectronic conductor layers having formed interposed between their patterns microelectronic dielectric layers formed of comparatively low dielectric constant dielectric materials.

It is towards the foregoing object that the present invention is directed.

Various damascene methods have been disclosed in the art of microelectronic fabrication for forming damascene structures with desirable properties.

Included among the damascene methods, but not limited among the damascene methods, are damascene methods disclosed within: (1) Huang, in U.S. Pat. No. 6,177,364 (a hydrogen/nitrogen plasma treatment method for treating exposed sidewall surfaces of a pair of fluorosilicate glass (FSG) inter-metal dielectric (IMD) layers within a dual damascene aperture such as to passivate the exposed sidewall surfaces with respect to mobile fluorine diffusion therefrom within the dual damascene aperture); and (2) Yu et al., in U.S. Pat. No. 6,187,663 (a damascene method for forming a damascene structure with enhanced performance by forming the damascene structure with an inter-metal dielectric (IMD) layer comprising a hydrogen silsesquioxane (HSQ) based dielectric layer having formed thereupon a fluorosilicate glass (FSG) dielectric layer).

Desirable in the art of microelectronic fabrication are additional damascene methods and materials which may be employed for providing microelectronic fabrications comprising patterned microelectronic conductor layers having formed interposed between their patterns microelectronic dielectric layers formed of comparatively low dielectric constant dielectric materials, with enhanced performance and enhanced reliability.

It is towards the foregoing object that the present invention is directed.

SUMMARY OF THE INVENTION

A first object of the present invention is to provide a damascene method for forming a microelectronic fabrication comprising a patterned microelectronic conductor layer having formed interposed between its patterns a microelectronic dielectric layer formed of a comparatively low dielectric constant dielectric material.

A second object of the present invention is to provide a damascene method in accord with the first object of the present invention, wherein the microelectronic fabrication is formed with enhanced performance and enhanced reliability.

A third object of the present invention is to provide a damascene method in accord with the first object of the present invention and the second object of the present invention, wherein the damascene method is readily commercially implemented.

In accord with the objects of the present invention, there is provided by the present invention a method for fabricating a microelectronic fabrication.

To practice the method of the present invention, there is first provided a substrate having formed therein a contact region. There is then formed over the substrate an etch stop layer comprising: (1) a first etch stop sub-layer formed from a comparatively low dielectric constant dielectric material; and (2) a second etch stop sub-layer formed upon the first etch stop sub-layer and formed from a comparatively high dielectric constant dielectric material. There is then formed over the etch stop layer an inter-metal dielectric layer having formed thereupon an anti-reflective coating layer. There is then formed, exposed and developed upon the anti-reflective coating layer a photoresist layer to form a patterned photoresist layer formed upon the anti-reflective coating layer. There is then patterned the anti-reflective coating layer and the inter-metal dielectric layer at least in part while employing the patterned photoresist layer as a mask to form a patterned anti-reflective coating layer and a patterned inter-metal dielectric layer which define an aperture which reaches the etch stop layer at a location above the contact region. There is then stripped the patterned photoresist layer from the patterned anti-reflective coating layer. Finally, there is then etched simultaneously the patterned anti-reflective coating layer and the etch stop layer to expose a top surface of the patterned inter-metal dielectric layer and to form from the aperture an extended aperture which exposes a top surface of the contact region.

Within the present invention, there may then be formed into the extended aperture (which may comprise a damascene aperture) a patterned conductor layer, while employing a damascene method, to provide the microelectronic fabrication with enhanced performance and enhanced reliability.

There is provided by the present invention a damascene method for forming within a microelectronic fabrication a patterned microelectronic conductor layer having formed interposed between its patterns a microelectronic dielectric layer formed of a comparatively low dielectric constant dielectric material, wherein the microelectronic fabrication is formed with enhanced performance and enhanced reliability.

The present invention realizes the foregoing object by employing when fabricating the microelectronic fabrication an etch stop layer comprising: (1) a first etch stop sub-layer formed from a comparatively low dielectric constant dielectric material; and (2) a second etch stop sub-layer formed upon the first etch stop sub-layer and formed from a comparatively high dielectric constant dielectric material, where the etch stop layer in turn has formed thereover: (1) an inter-metal dielectric layer having formed thereupon; (2) an anti-reflective coating layer in turn having formed thereupon (3) a patterned photoresist layer which is employed as an etch mask for forming from the foregoing two layers a corresponding patterned inter-metal dielectric layer having formed thereupon a patterned anti-reflective coating layer. Within the present invention, after having stripped the patterned photoresist layer from the patterned anti-reflective coating layer, the patterned anti-reflective coating layer is stripped from the patterned inter-metal dielectric layer while simultaneously etching the etch stop layer to form a patterned etch stop layer which exposes a contact region within a substrate over which is formed all of the foregoing layers.

The method in accord with the present invention is readily commercially implemented.

As will be illustrated in greater detail within the context of the Description of the Preferred Embodiment, as set forth below, the method of the present invention employs methods and materials as are otherwise generally known in the art of microelectronic fabrication, but employed within the context of specific process limitations and specific materials limitations to provide the method of the present invention. Since it is thus at least in part a series of specific process limitations and specific materials limitations which provides at least in part the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

Figure 1:
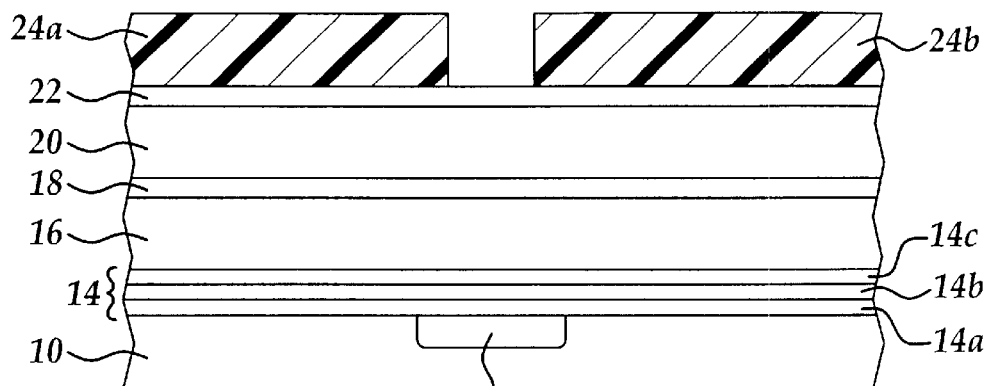
FIG. 1, FIG. 2, FIG. 3, FIG. 4, FIG. 5 and FIG. 6 show a series of schematic cross-sectional diagrams illustrating the results of progressive stages of forming, in accord with a preferred embodiment of the present invention, a microelectronic fabrication in accord with the present invention.

There is provided by the present invention a damascene method for forming a microelectronic fabrication comprising a patterned microelectronic conductor layer having formed interposed between its patterns a microelectronic dielectric layer formed of a comparatively low dielectric constant dielectric material, wherein the microelectronic fabrication is formed with enhanced performance and enhanced reliability.

The present invention realizes the foregoing object by employing when fabricating the microelectronic fabrication an etch stop layer comprising: (1) a first etch stop sub-layer formed from a comparatively low dielectric constant dielectric material; and (2) a second etch stop sub-layer formed upon the first etch stop sub-layer and formed from a comparatively high dielectric constant dielectric material, where the etch stop layer in turn has formed thereover: (1) an inter-metal dielectric layer having formed thereupon; (2) an anti-reflective coating layer in turn having formed thereupon (3) a patterned photoresist layer which is employed as an etch mask for forming from the foregoing two layers a corresponding patterned inter-metal dielectric layer having formed thereupon a patterned anti-reflective coating layer. Within the present invention, after having stripped the patterned photoresist layer from the patterned anti-reflective coating layer, the patterned anti-reflective coating layer is stripped from the patterned inter-metal dielectric layer while simultaneously etching the etch stop layer to form a patterned etch stop layer which exposes a contact region within a substrate over which is formed all of the foregoing layers.

The preferred embodiment of the present invention provides particular value within the context of forming, while employing a dual damascene method, and within a semiconductor integrated circuit microelectronic fabrication and with enhanced performance and enhanced reliability, a patterned conductor layer having formed interposed between its patterns a dielectric layer formed of a comparatively low dielectric constant dielectric material. However, the present invention may nonetheless be employed for forming, with enhanced performance and enhanced reliability, a microelectronic fabrication comprising a patterned microelectronic conductor layer having formed interposed between its patterns a microelectronic dielectric layer formed of a comparatively low dielectric constant dielectric material, while employing a damascene method, within a microelectronic fabrication selected from the group including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications. Similarly, the present invention may be employed for forming damascene structures including but not limited to single damascene structures and dual damascene structures.

Referring now to FIG. 1 to FIG. 6, there is shown a series of schematic cross-sectional diagrams illustrating the results of progressive stages in forming, in accord with a preferred embodiment of the present invention, a microelectronic fabrication in accord with the present invention.

Shown in FIG. 1 is a schematic cross-sectional diagram of the microelectronic fabrication at an early stage in its fabrication in accord with the preferred embodiment of the present invention.

Shown in FIG. 1, in a first instance, is a substrate 10 having formed therein a contact region 12.

Within the preferred embodiments of the present invention with respect to the substrate 10, the substrate 10 may be a substrate employed within a microelectronic fabrication selected from the group including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Although not specifically illustrated within the schematic cross-sectional diagram of FIG. 1, the substrate 10 may consist of a substrate alone as employed within the microelectronic fabrication, or in the alternative, the substrate 10 may comprise a substrate as employed within the microelectronic fabrication, wherein the substrate has formed thereupon and/or thereover any of several additional microelectronic layers as are conventionally employed within the microelectronic fabrication within which is employed the substrate. Similarly with the substrate alone as employed within the microelectronic fabrication, such additional microelectronic layers may be formed from microelectronic materials selected from the group including but not limited to microelectronic conductor materials, microelectronic semiconductor materials and microelectronic dielectric materials.

In addition, and although also not specifically illustrated within the schematic cross-sectional diagram of FIG. 1, the substrate 10, typically and preferably, but not exclusively, when the substrate 10 consists of or comprises a semiconductor substrate as employed within a semiconductor integrated circuit microelectronic fabrication, has formed therein and/or thereupon microelectronic devices as are similarly also conventional within the microelectronic fabrication within which is employed the substrate 10. Such microelectronic devices may be selected from the group including but not limited to resistors, transistors, diodes and capacitors.

Within the preferred embodiment of the present invention with respect to the contact region 12, the contact region 12 is typically and preferably either: (1) a semiconductor contact region (particularly under circumstances where the substrate 10 consists of or comprises a semiconductor substrate as employed within a semiconductor integrated circuit microelectronic fabrication); or (2) a conductor contact region (under circumstances where the substrate 10 is employed within any of the several microelectronic fabrications as noted above). More typically and preferably, and when the contact region 12 is a conductor contact region, the conductor contact region is formed employing a conductor metal or conductor metal alloy contact material, such as in particular a copper metal or a copper metal alloy (having a copper content of greater than about 85 weight percent] contact material).

Shown also within the schematic cross-sectional diagram of FIG. 1, and formed upon the substrate 10 having formed therein the contact region 12, is a series of layers comprising: (1) a blanket first etch stop/liner layer 14 formed upon the substrate 10 having formed therein the contact region 12; (2) a blanket first dielectric layer 16 formed upon the blanket first etch stop/liner layer 14; (3) a blanket second etch stop layer 18 formed upon the blanket first dielectric layer 16; (4) a blanket second dielectric layer 20 formed upon the blanket second etch stop layer 18; (5) a blanket anti-reflective coating (ARC) layer 22 formed upon the blanket second dielectric layer 20; and (6) a pair of patterned first photoresist layers 24a and 24b formed upon the blanket anti-reflective coating (ARC) layer 22.

Within the preferred embodiment of the present invention with respect to the blanket first etch stop/liner layer 14, and as is illustrated within the schematic cross-sectional diagram of FIG. 1, the blanket first etch stop/liner layer 14 is formed as a trilayer laminate comprising: (1) an optional blanket lower lying first etch stop/liner sub-layer 14a formed upon the substrate 10 having formed therein the contact region 12; (2) a blanket intermediate first etch stop/liner sub-layer 14b formed upon the optional blanket lower lying first etch stop/liner sub-layer 14a; and (3) a blanket upper lying first etch stop/liner sub-layer 14c formed upon the blanket intermediate first etch stop/liner sub-layer 14b. Within the present invention and the preferred embodiment of the present invention, the blanket lower lying first etch stop/liner sub-layer 14a and the blanket upper lying first etch stop/liner sub-layer 14c are formed of a comparatively high dielectric constant dielectric constant dielectric material (having a dielectric constant of from greater than about 4 to about 8) while the blanket intermediate first etch stop/liner sub-layer 14b is formed of a comparatively low dielectric constant dielectric material (having a dielectric constant of from about 1.5 to less than about 4).

Within the present invention and the preferred embodiment of the present invention with respect to the comparatively high dielectric constant dielectric material, the comparatively high dielectric constant dielectric material may be selected from the group including but not limited to dense silicon oxide dielectric materials, silicon nitride dielectric materials, silicon carbide dielectric materials and mixtures thereof, but preferably silicon nitride materials.

Within the preferred embodiment of the present invention with respect to the comparatively low dielectric constant dielectric material, materials selections for the comparatively low dielectric constant dielectric materials are identical to, and disclosed in greater detail below with respect to, materials selections for the blanket first dielectric layer 16 and the blanket second dielectric layer 20. Typically and preferably the low dielectric constant dielectric material is a fluorosilicate glass (FSG) dielectric material.

Within the preferred embodiment of the present invention, the blanket upper lying first etch stop/liner sub-layer 14c and the blanket lower lying first etch stop/liner sub-layer 14a are formed of a thickness minimally sufficient to serve a corresponding etch stop function or a corresponding barrier function. Typically and preferably, this will be from about 200 to about 300 angstroms.

Similarly, within the preferred embodiment of the present invention, the blanket intermediate first etch stop/liner sub-layer 14b is formed of a thickness keyed to a thickness of the blanket anti-reflective coating (ARC) layer 22 (whose thickness is in turn determined by photolithographic exposure radiation considerations), such that the blanket anti-reflective coating (ARC) layer 22 and the blanket first etch stop/liner layer 14 may simultaneously be completely etched within an equivalent etching time interval. Typically and preferably, the blanket intermediate first etch stop/liner sub-layer 14b is formed to a thickness of from about 500 to about 700 angstroms.

Within the present invention and the preferred embodiment of the present invention with respect to the blanket second etch stop layer 18, the blanket second etch stop layer 18 may be formed of a multilayer trilayer composition analogous, equivalent or identical to the blanket first etch stop/liner layer 14.

Within the preferred embodiment of the present invention with respect to the blanket anti-reflective coating (ARC) layer 22, and although other anti-reflective coating (ARC) materials are not precluded within the context of the present invention, the blanket anti-reflective coating (ARC) layer is typically and preferably formed of a silicon nitride anti-reflective coating (ARC) material or a silicon oxynitride anti-reflective coating (ARC) material. Typically and preferably, the blanket anti-reflective coating (ARC) layer 22 is formed to a thickness of from about 300 to about 1800 angstroms when employed as an anti-reflective coating (ARC) layer with respect to 248 nm to about 193 nm photoexposure radiation, although other photoexposure radiation correlating thickness are also feasible with respect to the blanket anti-reflective coating (ARC) layer 22.

Within the preferred embodiment of the present invention with respect to the blanket first dielectric layer 16 and the blanket second dielectric layer 20, and while the blanket first dielectric layer 16 and the blanket second dielectric layer 22 may be formed from any of several comparatively low dielectric constant dielectric materials as are conventional or unconventional in the art of microelectronic fabrication, including but not limited to spin-on-glass (SOG) dielectric materials, spin-on-polymer (SOP) dielectric materials, nanoporous dielectric materials, amorphous carbon dielectric materials and fluorosilicate glass (FSG) dielectric materials, the present invention provides particular value under circumstances where the blanket first dielectric layer 16 and the blanket second dielectric layer 20 are formed of a spin-on-polymer dielectric material, generally having a dielectric constant in a range of from about 2,000 to about 10,000. Each of the blanket first dielectric layer 16 and the blanket second dielectric layer 20 is formed of the same dielectric material, although such limitation is not required within the present invention and the preferred embodiment of the present invention.

Finally, within the preferred embodiment of the present invention with respect to the pair of patterned first photoresist layers 24a and 24b, the pair of patterned first photoresist layers 24a and 24b may be formed from any of several photoresist materials as are conventional in the art of microelectronic fabrication, including but not limited to photoresist materials selected from the general groups of photoresist materials including but not limited to positive photoresist materials and negative photoresist materials. Typically and preferably, each of the pair of patterned first photoresist layers 24a and 24b is formed to a thickness of from about 3,000 to about 8,000 angstroms.

As is understood by a person skilled in the art, the pair of patterned first photoresist layers 24a and 24b defines the location of an via, of linewidth from about 0.13 to about 0.25 microns, to be formed through the blanket anti-reflective coating layer 22, the blanket second dielectric layer 20, the blanket second etch stop layer 18, the blanket first dielectric layer 16 and the blanket first etch stop/liner layer 14, in order to access the contact region 12.

Figure 2:
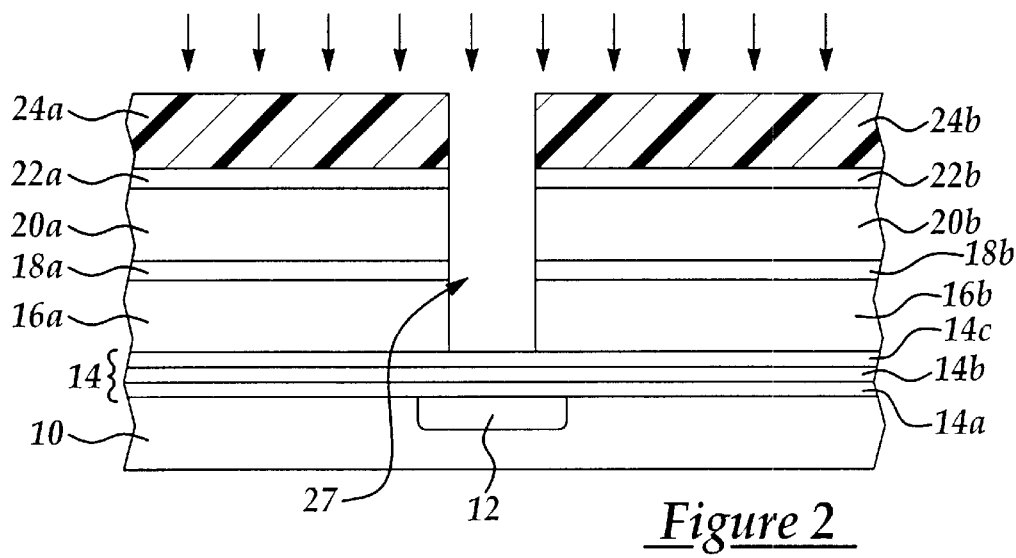

Referring now to FIG. 2, there is shown a schematic cross-sectional diagram illustrating the results of further processing of the microelectronic fabrication whose schematic cross-sectional diagram is illustrated in FIG. 1.

Shown in FIG. 2 is a schematic cross-sectional diagram of a microelectronic fabrication otherwise equivalent to the microelectronic fabrication whose schematic cross-sectional diagram is illustrated in FIG. 1, but wherein: (1) the blanket anti-reflective coating layer 22 has been patterned to form a pair of patterned anti-reflective coating layers 22a and 22b; (2) the blanket second dielectric layer 20 has been patterned to form a pair of patterned second dielectric layers 20a and 20b; (3) the blanket second etch stop layer 18 has been patterned to form a pair of patterned second etch stop layers 18a and 18b; and (4) the blanket first dielectric layer 16 has been patterned to form a pair of patterned first dielectric layers 16a and 16b, while employing the pair of patterned photoresist layers 24a and 24b as a first etch mask layer and while employing the blanket first etch stop/liner layer 14 as an etch stop layer, in conjunction with a first etching plasma 26. As is illustrated within the schematic cross-sectional diagram of FIG. 2, the foregoing series of patterned layers defines an aperture 27 aligned above the contact region 12.

Within the preferred embodiment of the present invention, the first etching plasma 26 will typically and preferably employ an etchant gas composition, or a sequential combination of etchant gas compositions, as appropriate to the materials from which are formed the blanket anti-reflective coating (ARC) layer 22, the blanket second dielectric layer 20, the blanket second etch stop layer 18 and the blanket first dielectric layer 16. Typically and preferably, the etchant gas composition will employ, at least in part, a fluorine containing etchant gas composition.

Figure 3:
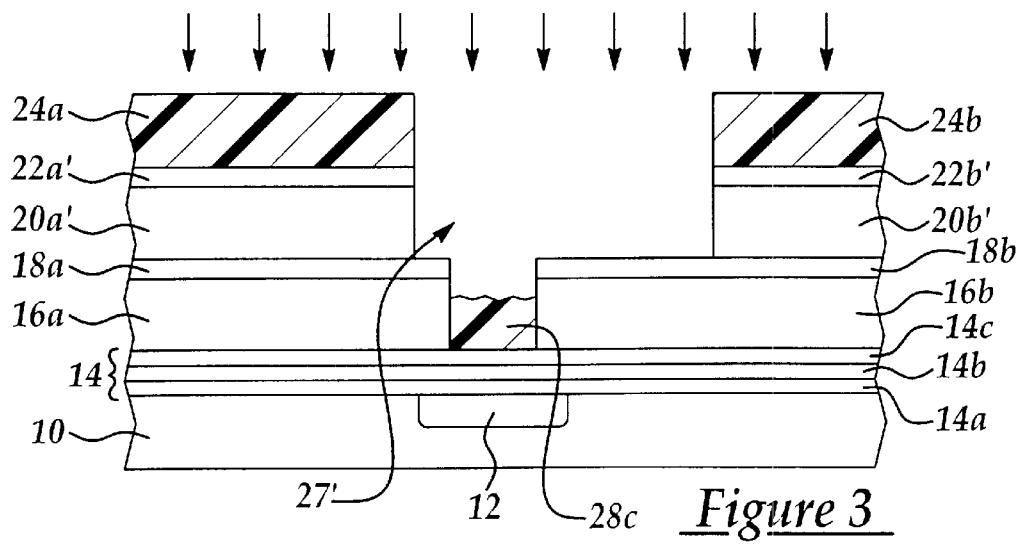

Referring now to FIG. 3, there is shown a schematic cross-sectional diagram illustrating the results of further processing of the microelectronic fabrication whose schematic cross-sectional diagram is illustrated in FIG. 2.

Shown in FIG. 3 is a schematic cross-sectional diagram of a microelectronic fabrication otherwise equivalent to the microelectronic fabrication whose schematic cross-sectional diagram is illustrated in FIG. 2, but wherein, in a first instance, the pair of patterned photoresist layers 24a and 24b has been stripped from the pair of patterned anti-reflective coating (ARC) layers 22a and 22b as illustrated within the schematic cross-sectional diagram of FIG. 2.

Within the present invention and the preferred embodiment of the present invention, the pair of patterned photoresist layers 24a and 24b may be stripped from the pair of patterned anti-reflective coating (ARC) layers 22a and 22b to provide in part the microelectronic fabrication whose schematic cross-sectional diagram is illustrated in FIG. 3 from the microelectronic fabrication whose schematic cross-sectional diagram is illustrated in FIG. 2 while employing methods as are conventional in the art of microelectronic fabrication.

Shown also within the schematic cross-sectional diagram of FIG. 3, and formed upon the pair of patterned anti-reflective coating (ARC) layers 22a and 22b as illustrated in the schematic cross-sectional diagram of FIG. 2 is a corresponding pair of generally conventional patterned second photoresist layers 28a and 28b. As is understood by a person skilled in the art, the pair of patterned second photoresist layers 28a and 28b is employed for defining the location of a trench to be formed through at least the pair of patterned second dielectric layers 20a and 20b, wherein the trench is contiguous with, larger than and overlaps with the via whose location is defined by the pair of patterned first photoresist layers 24a and 24b. Also shown within the schematic cross-sectional diagram of FIG. 3 is a photoresist residue plug 28c [which desirably results from incomplete photoexposure and development of a photoresist material from which is formed the pair of patterned second photoresist layers 28a and 28b, when formed of a positive photoresist material.

There is also shown within schematic cross-sectional diagram of FIG. 1 the results of: (1) etching the pair of patterned anti-reflective coating (ARC) layers 22a and 22b to form a pair of twice patterned anti-reflective coating (ARC) layers 22a and 22b; and (2) etching the pair of patterned second dielectric layers 20a and 20b to form a pair of twice patterned second dielectric layers 20a and 20b, while employing the pair of patterned second photoresist layers 28a and 28b, along with the photoresist residue plug 28c, as a second etch mask layer. The patterning is undertaken employing a second etching plasma 30 which is otherwise conventional in the art of microelectronic fabrication and analogous or equivalent to the first etching plasma 26 as illustrated within the schematic cross-sectional diagram of FIG. 2.

As is also illustrated within the schematic cross-sectional diagram of FIG. 3 incident to the foregoing patterning, there is formed from the aperture 27 as illustrated within the schematic cross-sectional diagram of FIG. 2 an enlarged aperture 27'.

Figure 4:
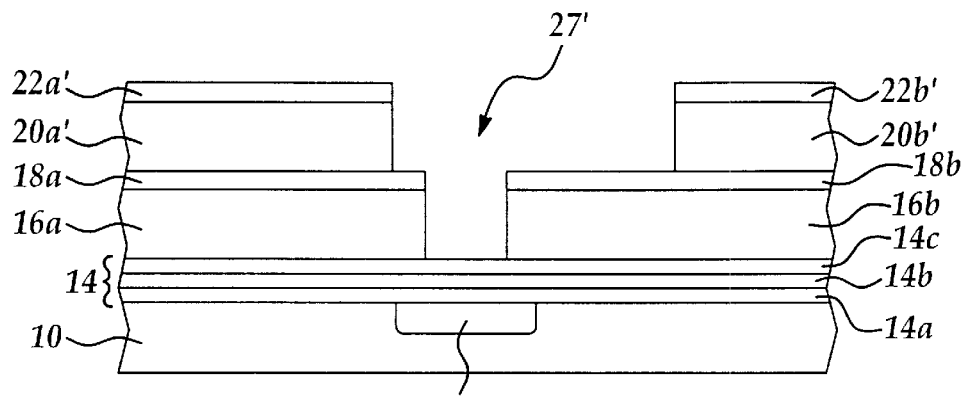

Referring now to FIG. 4, there is shown a schematic cross-sectional diagram illustrating the results of further processing of the microelectronic fabrication whose schematic cross-sectional diagram is illustrated in FIG. 3.

Shown in FIG. 4 is a schematic cross-sectional diagram of a microelectronic fabrication otherwise equivalent to the microelectronic fabrication whose schematic cross-sectional diagram is illustrated in FIG. 3, but wherein there has been: (1) stripped from the pair of twice patterned anti-reflective coating (ARC) layers 22a and 22b the pair of patterned second photoresist layers 28a and 28b; and (2) stripped from the blanket first etch stop/barrier layer 14 the photoresist residue plug 28c.

The foregoing photoresist layers and plug may be stripped employing methods as are conventional in the art of microelectronic fabrication.

Figure 5:
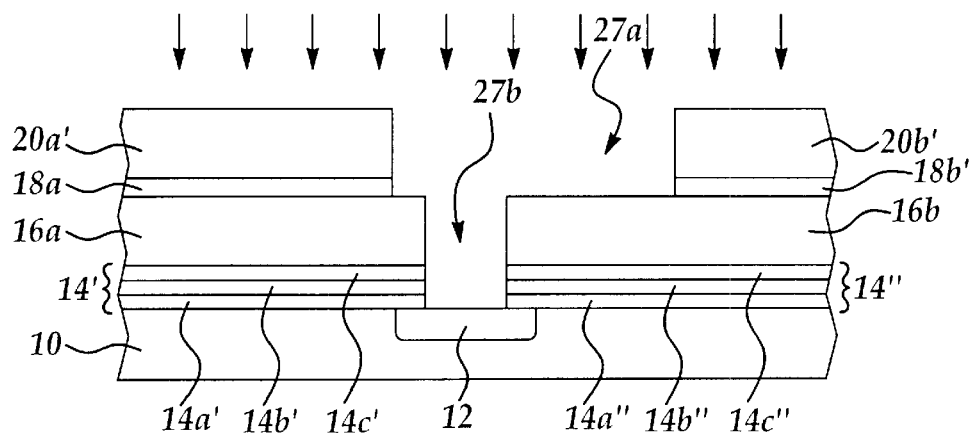

Referring now to FIG. 5, there is shown a schematic cross-sectional diagram illustrating the results of further processing of the microelectronic fabrication whose schematic cross-sectional diagram is illustrated in FIG. 4.

Shown in FIG. 5 is a schematic cross-sectional diagram of a microelectronic fabrication otherwise equivalent to the microelectronic fabrication whose schematic cross-sectional diagram is illustrated in FIG. 4, but wherein there is simultaneously: (1) stripped from the pair of twice patterned second dielectric layers 20a and 20b the pair of twice patterned anti-reflective coating (ARC) layers 22a and 22b; (2) further patterned the pair of patterned second etch stop layers 18a and 18b to form a pair of twice patterned second etch stop layers 18a' and 18b' which leave exposed surface portions of the patterned first dielectric layers 16a and 16b; and (3) etched the blanket first etch stop/liner layer 14 to form a pair of patterned first etch stop/liner layers 14' and 14" (which are formed of a correlating series of sub-layers 14a', 14b', 14c', 14a", 14b" and 14c"), while employing a third etching plasma 32 (absent a photoresist mask). Incident to the foregoing etching, there is formed from the enlarged aperture 27' a dual damascene aperture 27" which comprises a trench 27a contiguous with a via 27b, as discussed above.

Within the preferred embodiment of the present invention, the third etching plasma 32 employs methods and materials as are specific to the materials from which are formed the blanket anti-reflective coating (ARC) layer 22, the blanket second etch stop layer 18 and the blanket first etch stop/liner layer 14. Similarly, and in accord with the foregoing disclosure, etchant conditions, materials compositions and thicknesses are selected such that the pair of twice patterned anti-reflective coating (ARC) layers 22a' and 22b', the pair of patterned second etch stop layers 18a and 18b and the blanket first etch stop/liner layer 14 etch within an equivalent time interval to leave exposed surfaces of the twice patterned second dielectric layers 20a' and 20b', the patterned first dielectric layers 16a and 16b and the contact region 12.

Within the present invention, and since the blanket first etch stop/liner layer 14 (and preferably also the blanket second etch stop layer 18) is formed as a tri-layer construction with a thickness of the blanket upper lying first etch stop/liner layer 14c minimally sufficient to provide effective etch stop properties, there is employed within the microelectronic fabrication whose schematic cross-sectional diagram is illustrated in FIG. 5 a minimal vertically spaced amount of a comparatively high dielectric constant dielectric etch stop material and a maximum vertically spaced amount of comparatively low dielectric constant dielectric material.

Similarly, by completely stripping from the microelectronic fabrication whose schematic cross-sectional diagram is illustrated in FIG. 4 the pair of twice patterned anti-reflective coating layers 22a' and 22b' to leave exposed the surface portions of the pair of twice patterned second dielectric layers 20a' and 20b', incident to further sputter clean processing of the microelectronic fabrication whose schematic cross-sectional diagram is illustrated in FIG. 5 there is provided for inhibited particulate formation which would otherwise result from sputtering of a remainder portion of the pair of twice patterned anti-reflective coating layers 22a' and 22b'.

Figure 6:
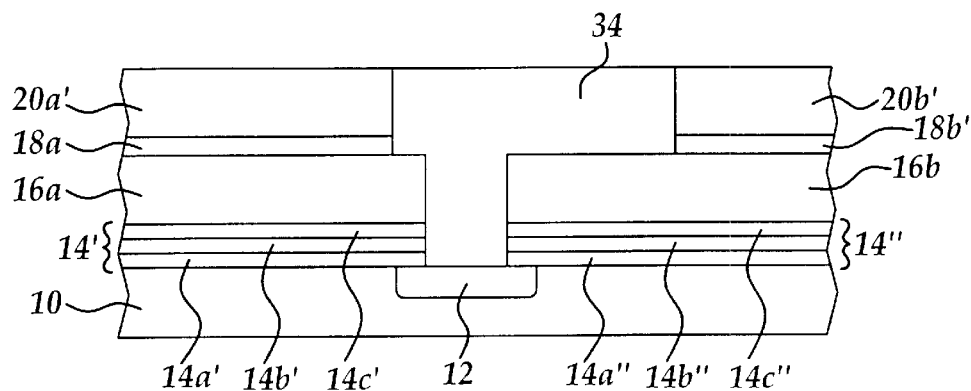

Referring now to FIG. 6, there is shown a schematic cross-sectional diagram illustrating the results of further processing of the microelectronic fabrication whose schematic cross-sectional diagram is illustrated in FIG. 5.

Shown in FIG. 6 is a schematic cross-sectional diagram of a microelectronic fabrication otherwise equivalent to the microelectronic fabrication whose schematic cross-sectional diagram is illustrated in FIG. 5, but wherein there is formed into the dual damascene aperture 27" a contiguous patterned conductor interconnect and patterned conductor stud layer 34.

Within the preferred embodiment of the present invention, the contiguous patterned conductor interconnect and patterned conductor stud layer 34 is formed employing a damascene method which employs a planarizing, preferably a chemical mechanical polish (CMP) planarizing, of a blanket conductor layer formed upon the microelectronic fabrication whose schematic cross-sectional diagram is illustrated in FIG. 5 and filling the dual damascene aperture 27".

Within the preferred embodiment of the present invention, the contiguous patterned conductor interconnect and patterned conductor stud layer 34 may be formed of materials including but not limited to metal, metal alloy, doped polysilicon (having a dopant concentration of greater than about 1E19 dopant atoms per cubic centimeter) and polycide (doped polysilicon/metal silicide stack) materials, although metal and metal alloy materials, and in particular copper and copper alloy materials, are particularly preferred. Similarly, and although not specifically illustrated within the schematic cross-sectional diagram of FIG. 6, the contiguous patterned conductor interconnect and patterned conductor stud layer 34 typically and preferably has formed as its lower portion a barrier layer which inhibits interdiffusion of the contiguous patterned conductor interconnect and patterned conductor stud layer 34 with the series of patterned dielectric and etch stop layers with which it is adjacent within the dual damascene aperture 27" whose schematic cross-sectional diagram is illustrated in FIG. 5.

Upon forming the microelectronic fabrication whose schematic cross-sectional diagram is illustrated in FIG. 6, there is provided by the present invention a damascene method for forming a microelectronic fabrication comprising a patterned microelectronic conductor layer having formed interposed between its patterns a microelectronic dielectric layer formed of a comparatively low dielectric constant dielectric material, wherein the microelectronic fabrication is formed with enhanced performance and enhanced reliability.

The present invention realizes the foregoing object by employing when fabricating the microelectronic fabrication an etch stop layer comprising: (1) a first etch stop sub-layer formed from a comparatively low dielectric constant dielectric material; and (2) a second etch stop sub-layer formed upon the first etch stop sub-layer and formed from a comparatively high dielectric constant dielectric material, where the etch stop layer in turn has formed thereover: (1) an inter-metal dielectric layer having formed thereupon; (2) an anti-reflective coating layer in turn having formed thereupon (3) a patterned photoresist layer which is employed as an etch mask for forming from the foregoing two layers a corresponding patterned inter-metal dielectric layer having formed thereupon a patterned anti-reflective coating layer. Within the present invention, after having stripped the patterned photoresist layer from the patterned anti-reflective coating layer, the patterned anti-reflective coating layer is stripped from the patterned inter-metal dielectric layer while simultaneously etching the etch stop layer to form a patterned etch stop layer which exposed a contact region within a substrate over which is formed all of the foregoing layers.

As is understood by a person skilled in the art, the preferred embodiment of the present invention is illustrative of the present invention rather than limiting of the present invention. Revisions and modifications may be made to methods, materials, structures and dimensions through which is provided a dual damascene structure in accord with the preferred embodiment of the present invention, which still providing a method for fabricating a microelectronic fabrication in accord with the present invention, further in accord with the accompanying claims.

What is claimed is:

1. A method for fabricating a microelectronic fabrication comprising:

providing a substrate having formed therein a contact region;

forming over the substrate and contacting the contact region an etch stop layer comprising:
a first etch stop sub-layer formed from a comparatively low dielectric constant dielectric material; and
a second etch stop sub-layer formed upon the first etch stop sub-layer and formed from a comparatively high dielectric constant dielectric material;

forming over the etch stop layer an inter-metal dielectric layer having formed thereupon an anti-reflective coating layer;

forming a patterned anti-reflective coating layer and a patterned inter-metal dielectric layer which define an aperture which reaches the etch stop layer at a location above the contact region; and removing the remaining anti-reflective coating layer to expose a top surface of the patterned inter-metal dielectric layer.

2. The method of claim 1 wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

3. The method of claim 1 wherein the comparatively high dielectric constant dielectric material is selected from the group consisting of silicon oxide dielectric materials, silicon nitride dielectric materials, silicon carbide dielectric materials and mixtures thereof.

4. The method of claim 1 wherein the comparatively low dielectric constant dielectric material is selected from the group consisting of spin-on-glass dielectric materials, spin-on-polymer dielectric materials, nanoporous dielectric materials, amorphous carbon dielectric materials and fluorosilicate glass dielectric materials.

5. The method of claim 1 wherein:
the first etch stop sub-layer is formed to a thickness of from about 100 to about 500 angstroms; and
the second etch stop sub-layer is formed to a thickness of from about 100 to about 500 angstroms.

6. The method of claim 1 wherein the inter-metal dielectric layer is also formed of a comparatively low dielectric constant dielectric material.

7. The method of claim 1 wherein the anti-reflective coating layer is formed to a thickness of from about 300 to about 1800 angstroms.

8. A method for fabricating a microelectronic fabrication comprising:

providing a substrate having formed therein a contact region;

forming over the substrate an etch stop layer comprising:
a first etch stop sub-layer formed from a comparatively high dielectric constant dielectric material;

a second etch stop sub-layer formed upon the first etch stop sub-layer and formed from a comparatively low dielectric constant dielectric material; and a third etch stop sub-layer formed upon the second etch stop sub-layer and formed from a comparatively high dielectric constant dielectric material;

forming over the etch stop layer an inter-metal dielectric layer having formed thereupon an anti-reflective coating layer;

forming, exposing and developing upon the anti-reflective coating layer a photoresist layer to form a patterned photoresist layer formed upon the anti-reflective coating layer;

patterning the anti-reflective coating layer and the inter-metal dielectric layer at least in part while employing the patterned photoresist layer as a mask to form a patterned anti-reflective coating layer and a patterned inter-metal dielectric layer which define an aperture which reaches the etch stop layer at a location above the contact region;

stripping the patterned photoresist layer from the patterned anti-reflective layer; and etching simultaneously the patterned anti-reflective coating layer and the etch stop layer to expose a top surface of the patterned inter-metal dielectric layer and to form from the aperture an extended aperture which exposes a top surface of the contact region.

9. The method of claim 8 wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

10. The method of claim 8 wherein the comparatively high dielectric constant dielectric material is selected from the group consisting of silicon oxide dielectric materials, silicon nitride dielectric materials, silicon carbide dielectric materials and mixtures thereof.

11. The method of claim 8 wherein the comparatively low dielectric constant dielectric material is selected from the group consisting of spin-on-glass dielectric materials, spin-on-polymer dielectric materials, nanoporous dielectric materials, amorphous carbon dielectric materials and fluorosilicate glass dielectric materials.

12. The method of claim 8 wherein:

the first etch stop sub-layer is formed to a thickness of from about 100 to about 500 angstroms;

the second etch stop sub-layer is formed to a thickness of from about 100 to about 500 angstroms;

the third etch stop sub-layer is formed to a thickness of from about 100 to about 500 angstroms.

13. The method of claim 8 wherein the inter-metal dielectric layer is also formed of a comparatively low dielectric constant dielectric material.

14. The method of claim 8 wherein the anti-reflective coating layer is formed to a thickness of from about 300 to about 1800 angstroms.

* * * * *